United States Patent
Hudson et al.

(10) Patent No.: US 6,605,500 B2
(45) Date of Patent: Aug. 12, 2003

(54) ASSEMBLY PROCESS

(75) Inventors: Edison T. Hudson, Chapel Hill, NC (US); Ernest H. Fischer, Seedorf (CH)

(73) Assignee: Infotech AG, Solothurn (CH)

( * ) Notice: Subject to any disclaimer, the term of this patent is extended or adjusted under 35 U.S.C. 154(b) by 0 days.

(21) Appl. No.: 09/801,559

(22) Filed: Mar. 7, 2001

(65) Prior Publication Data

US 2001/0046723 A1 Nov. 29, 2001

Related U.S. Application Data

(60) Provisional application No. 60/188,635, filed on Mar. 10, 2000.

(51) Int. Cl.$^7$ .......................................... H01L 21/8238
(52) U.S. Cl. ...................... 438/200; 438/647; 382/145; 382/151
(58) Field of Search ........................ 438/646, 106–108, 438/118, 200

(56) References Cited

U.S. PATENT DOCUMENTS

| | | | |
|---|---|---|---|
| 3,610,508 A | 10/1971 | Laubmeyer | 228/8 |
| 4,437,114 A | 3/1984 | LaRussa | 358/101 |
| 4,613,942 A | 9/1986 | Chen | 364/513 |
| 4,668,095 A | 5/1987 | Maeda | 356/400 |
| 4,675,993 A | 6/1987 | Harada | 29/740 |
| 4,818,993 A | 4/1989 | Stockel | 340/825 |
| 4,890,241 A | 12/1989 | Hoffman et al. | 364/513 |

(List continued on next page.)

FOREIGN PATENT DOCUMENTS

| | | | | |
|---|---|---|---|---|
| DE | 43 30 467 C | 9/1994 | | |
| DK | 43 30 467 C 1 | 9/1993 | | H05K/3/34 |
| DK | 42 16 242 A 1 | 11/1993 | | G06F/13/10 |
| DK | 296 15 180 U 1 | 12/1996 | | H03K/17/945 |
| DK | 2 609 919 | 10/1997 | | |

(List continued on next page.)

OTHER PUBLICATIONS

A copy of the International Search Report International App. No. PCT/IB01/00450 INFO–006PCT is enclosed 5 pages.

A copy of the International Search Report International App. No.: PCT/IB01/00610 INFO–009PCT is enclosed 4 pages.

A copy of the International Search Report International App. No.: PCT/US01/07226 META–008PCT is enclosed 4 pages.

(List continued on next page.)

Primary Examiner—David Nelms
Assistant Examiner—Dung Anh Le
(74) Attorney, Agent, or Firm—Thelen Reid & Priest LLP; David B. Ritchie

(57) ABSTRACT

A method and apparatus for component to substrate assembly permits in situ reflow of a flip chip (or other suitable component) in a manner which promotes proper settling of the component as solder begins to flow at the contact points between the component and the substrate. The component is heated and held by a pick-up head while applying downforce that serves to level the component. The initiation of solder reflow can be detected with the pick-up head by sensing a decrease in the downforce. Downforce applied to the component with the pick-up head is then decreased and the retention mechanism holding the component is released, freeing the component from the pick-up head and permitting the component to properly self-center using the liquid solder's surface tension.

11 Claims, 5 Drawing Sheets

U.S. PATENT DOCUMENTS

| | | | |
|---|---|---|---|
| 4,911,543 A | 3/1990 | Hodgson | 350/508 |
| 5,081,336 A | 1/1992 | Schuster et al. | 219/85.16 |
| 5,195,234 A | 3/1993 | Pine et al. | 29/720 |
| 5,452,201 A | 9/1995 | Pieronek et al. | 364/188 |
| 5,483,440 A | 1/1996 | Aono et al. | 364/167 |
| 5,576,946 A | 11/1996 | Bender et al. | 364/146 |
| 5,588,109 A | 12/1996 | Dickinson et al. | 395/326 |
| 5,701,661 A | 12/1997 | Van den Brink | 29/721 |
| 5,768,759 A | 6/1998 | Hudson | 29/407 |
| 5,805,442 A | 9/1998 | Crater et al. | 364/138 |
| 5,812,394 A | 9/1998 | Lewis et al. | 364/146 |
| 5,821,994 A | 10/1998 | Tani | 348/207 |
| 5,903,662 A | 5/1999 | DeCarlo | 382/151 |
| 6,332,269 B1 * | 12/2001 | Gamel et al. | 29/705 |
| 6,408,090 B1 * | 6/2002 | Salomon et al. | 348/87 |

FOREIGN PATENT DOCUMENTS

| | | | | |
|---|---|---|---|---|
| DK | 196 42 737 A1 | 10/1997 | | B60R/16/02 |
| DK | 196 49 082 | 1/1998 | | B25J/3/04 |
| EP | 0 275 992 A2 | 1/1988 | | G05B/19/417 |
| EP | 0 449 481 A1 | 10/1991 | | H05K/13/04 |
| EP | 0 476 851 A2 | 3/1992 | | H05K/13/04 |
| EP | 0 777 263 A2 | 6/1997 | | H01L/21/00 |
| EP | 0 825 506 A2 | 2/1998 | | G05B/19/418 |
| EP | 0 932 103 A1 | 7/1999 | | G06F/13/10 |
| FR | 2 609 919 A | 7/1988 | | |
| GB | 2 257 538 A | 1/1993 | | G05B/19/02 |
| WO | 89/04578 | 5/1989 | | H04Q/3/00 |
| WO | 91/19237 | 12/1991 | | |
| WO | 95/30964 | 11/1995 | | G06K/9/00 |
| WO | 99/48276 | 9/1999 | | H04N/1/00 |
| WO | 00/04428 | 1/2000 | | G05B/19/042 |
| WO | 00/08588 | 2/2000 | | |

OTHER PUBLICATIONS

Halpert, et al, "Object Oriented Programming for Motion Control", Conference Record of 1991 Forty–Third Annual Conference of Electrical Engineering Problems in the Rubber and Plastics Industries; Apr. 15 & 16, 1991; pp. 58–68.

A copy of the International Search Report International App. No. PCT/US01/07586 META–007PCT is enclosed 8 pages.

A copy of the International Search Report International App. No.: PCT/US01/07587 META–003PCT is enclosed 4 pages.

A copy of the International Search Report International App. No.: PCT/US01/07236 META–004PCT is enclosed 4 pages.

A copy of the International Search Report International App. No.: PCT/IB01/00453 INFO–002PCT is enclosed 4 pages.

Patent Abstracts of Japan, Publication No. 11355625, Publication Date Dec. 24, 1999, App. No. 10158852, Inv. Kobayashi Tsutomu.

Smith, et al., "CyberCut: A World Wide Web Based Design–to–Fabrication Tool", pp. 432–442, Journal of Manufacturing Systems vol. 15/No. 6 1996.

* cited by examiner

ASSEMBLY PROCESS

RELATED APPLICATIONS

This application claims the benefit of provisional U.S. Patent Application Ser. No. 60/188,635 filed on Mar. 10, 2000 in the names of Edison T. Hudson and Ernest H. Fischer and commonly assigned herewith.

FIELD OF THE INVENTION

The present invention is related to the alignment and registration of components onto substrates in a machine placement environment. More particularly, the present invention is directed a process for in situ reflow of a flip chip-type semiconductor product in a manner which promotes proper settling of the chip onto a substrate as solder begins to flow. The present invention may also be used with any type of component to substrate soldering or bonding where it is useful to apply a downforce to assist in holding alignment prior to a change taking place in the bonding material, the change affecting the applied downforce.

BACKGROUND OF THE INVENTION

Robotic assembly equipment is well known in the art. Such equipment includes, for example, pick and place (or placement) machines. A placement machine is a robotic instrument for picking up electronic and similar parts from component feeders and placing them at their assigned locations on a substrate such as a printed circuit board (PCB). Once all parts are placed, the PCB is placed in a reflow oven and solder paste disposed on the PCB melts or "reflows" forming permanent electrical connections between conductive pads on the PCB and electrical contacts, leads or "pins" on the electrical components.

Occasionally there are problems with the permanent electrical connections. For example, two pads of the PCB may become inadvertently bridged by solder, forming a short; the component may be mis-located; the component may prove faulty; and the like. In these situations, it is often economically desirable to salvage the partially assembled PCB rather than to scrap it. In order to salvage the PCB, one must remove the faulty component, re-prepare the PCB surface, and place and solder a new component (or a cleaned component) in the correct position on the PCB. This process is termed "rework". Reworking thus involves reflowing the solder of an identified target component (and not that of the entire PCB), removing the faulty component; cleaning and refluxing the PCB in the location where the component is to be mounted, reinstalling the component and reflowing the solder for the component.

In the past, most known placement systems locate the part over the substrate, place it, and then the part is released, placed in a reflow oven, and allowed to reflow. Generally the surface tension properties of the molten solder cause the pins of the part to more or less self-center on corresponding pads of the substrate resulting in a good electrical contact. Similarly, known rework systems rely on the self-centering on the pins of the part to the pads of the substrate to achieve accurate placement. While the existing systems operate relatively effectively, as pin densities increase, it is becoming more desirable to exert additional control on the placement of flip chip-type parts, particularly as the value of such parts tends to be higher than other electronic parts used in the fabrication of PCBs.

BRIEF DESCRIPTION OF THE INVENTION

A method and apparatus for component to substrate assembly permits in situ reflow of a flip chip (or other suitable component) in a manner which promotes proper settling of the component as solder begins to flow at the contact points between the component and the substrate. The pick-up head of a placement machine heats the component while applying up to several grams of downward force that serves to level the component. The downward force (downforce) is accurately measured using an electronic force sensor such as a strain gauge, force sensitive resistor, or any other suitable type of force sensor. The initiation of solder reflow can be detected with the pick-up head by sensing a decrease in the downforce. At this instant, the downforce applied to the component with the pick-up head is decreased preferably to zero and the vacuum or other retention mechanism holding the component is then released, freeing the component from the pick-up head and permitting the component to properly self-center using the liquid solder's surface tension. Further, at the instant that solder reflow is detected, the pick-up head may optionally be displaced a short distance from the component. However, because the pick-up head must (where it is used to supply heat) continue to supply heat to complete the reflow of the solder, it is only displaced a minimal distance from the component so that heating by radiation continues to reflow the solder while the pick-up head is displaced from the chip. The approach is applicable to other assembly processes where downforce is helpful to stabilize a component prior to final bonding and a change in measured downforce indicated the beginning of melting, curing or another process which indicates that downforce can be removed.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of an in-situ flip chip assembly process. Those of ordinary skill in the art will realize that the following detailed description of the present invention is illustrative only and is not intended to be in any way limiting. Other embodiments of the present invention will readily suggest themselves to such skilled persons having the benefit of this disclosure. For example, the present invention can be used in any component to substrate bonding process where downforce is helpful to provide stabilization of the component and a change, such as in a bonding material like solder, an adhesive, a conductive adhesive, and the like, can be detected with a force sensor so as to signify a time to remove the applied downforce. Such components may include flip chip semiconductor packages, other types of semiconductor packages (e.g., leaded, bumped, quad flat pack, tab, and the like) as well as electro-optical components, electro-mechanical components, micro-electronic-machine (MEMS) devices, and the like. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, certain components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
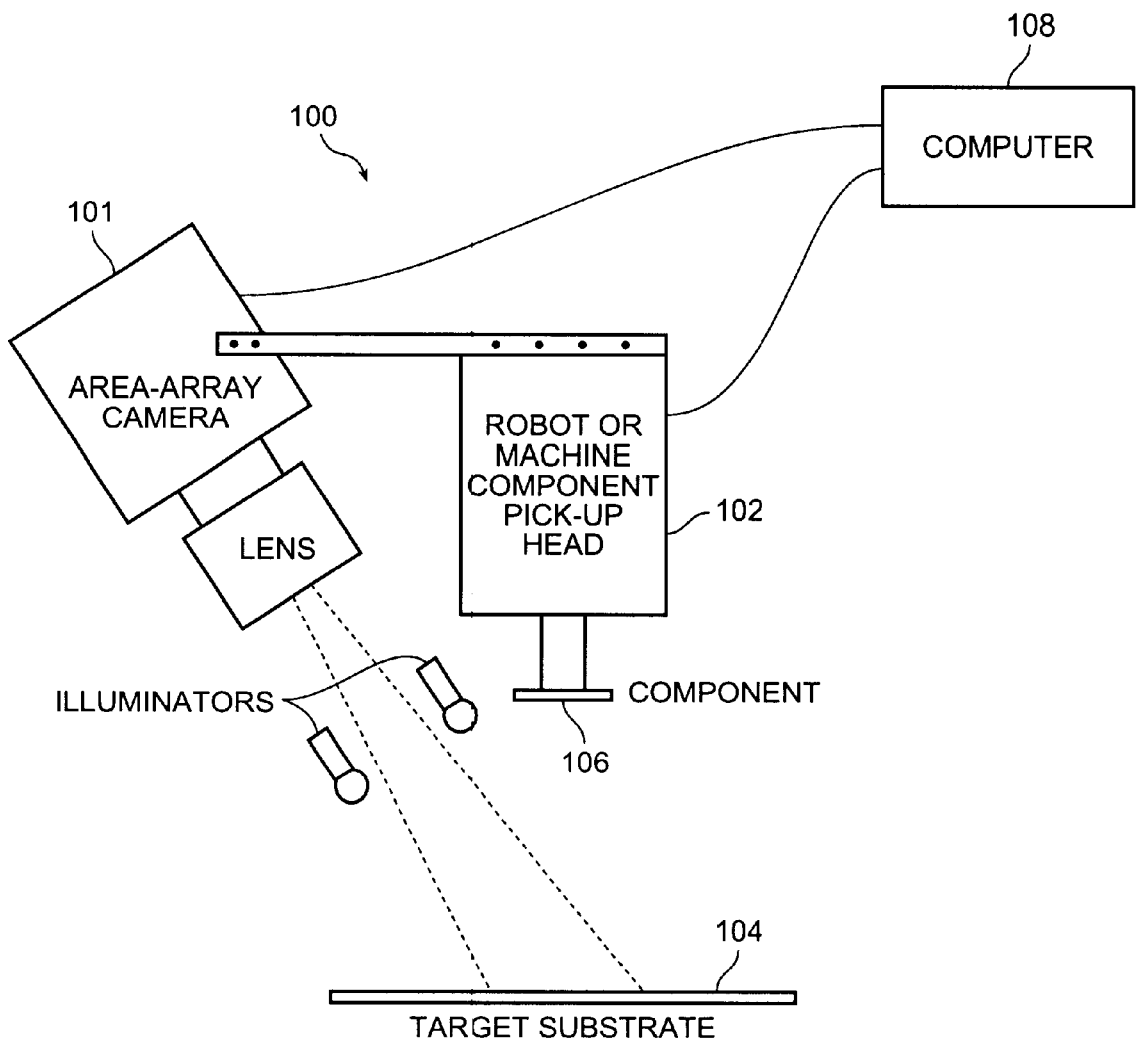
FIG. 1 is a schematic diagram of a portion of a placement machine in which an in situ flip chip assembly apparatus would operate in accordance with a specific embodiment of the present invention.

FIG. 1 is a schematic diagram of a portion of a placement machine in which an in situ flip chip assembly apparatus would operate in accordance with a specific embodiment of the present invention. The in situ flip chip assembly apparatus of the present invention may be carried out with the apparatus illustrated in FIG. 1. A typical placement or rework machine 100 will include an imaging device 101 of some type to help guide a pick-up head 102 to accurately provide relative alignment between a target substrate 104 and a component 106 being placed. Such imaging systems are well known to those of ordinary skill in the art and any such suitable system may be used with the present invention. The imaging system may include computer 108 to carry out image processing and machine vision tasks as well as position control tasks for the placement/rework machine 100. Such systems are well known in the prior art and will not be further described herein to avoid over-complicating the disclosure. While one camera is shown in FIG. 1, many such imaging systems use two cameras or a camera for substrate registration and another optical registration device for component registration such as the LaserAlign product available from CyberOptics Corporation of Golden Valley, Minn.

Figure 2A:
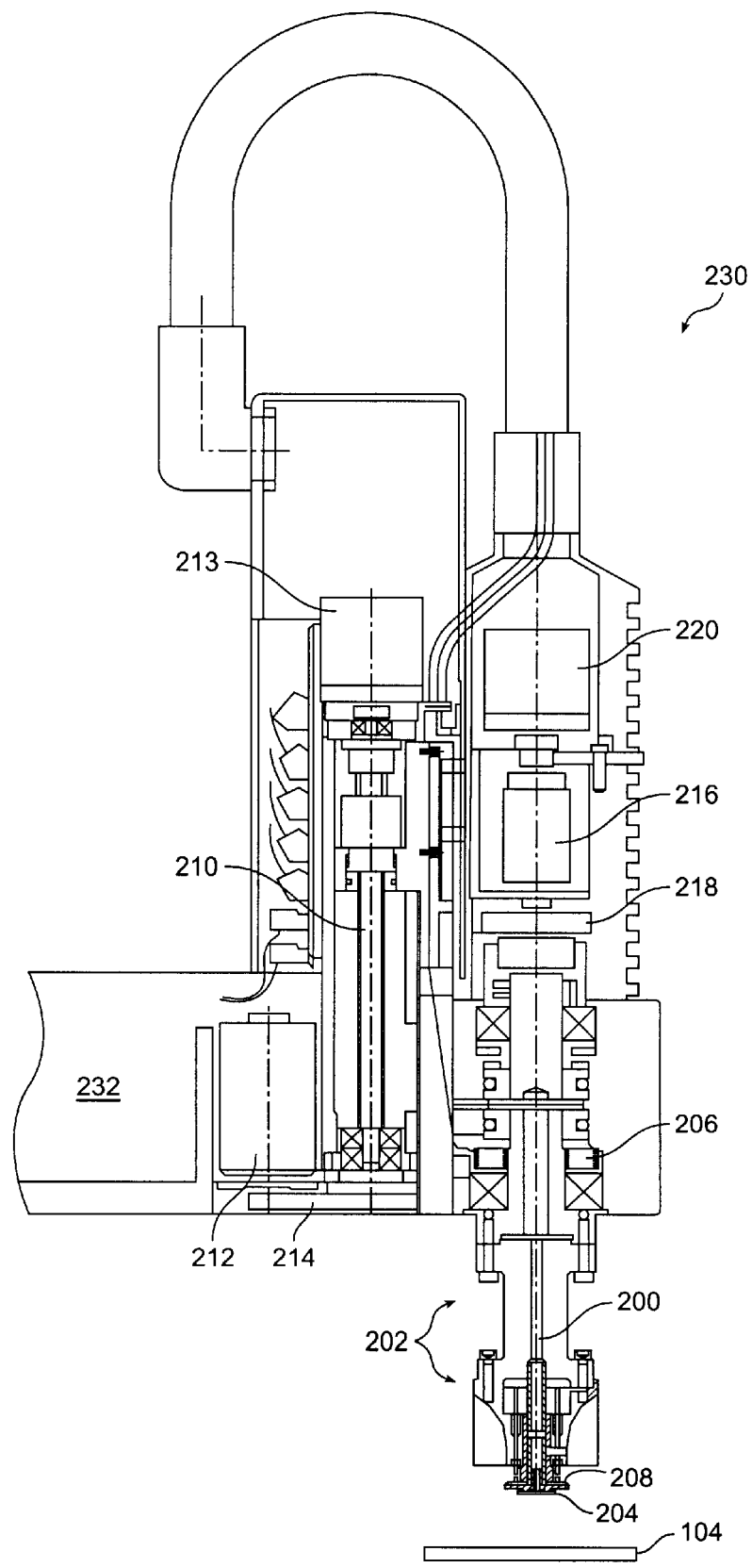
FIG. 2A is an elevational cross-sectional diagram illustrating an in situ flip chip assembly apparatus in accordance with a specific embodiment of the present invention.
Figure 2B:
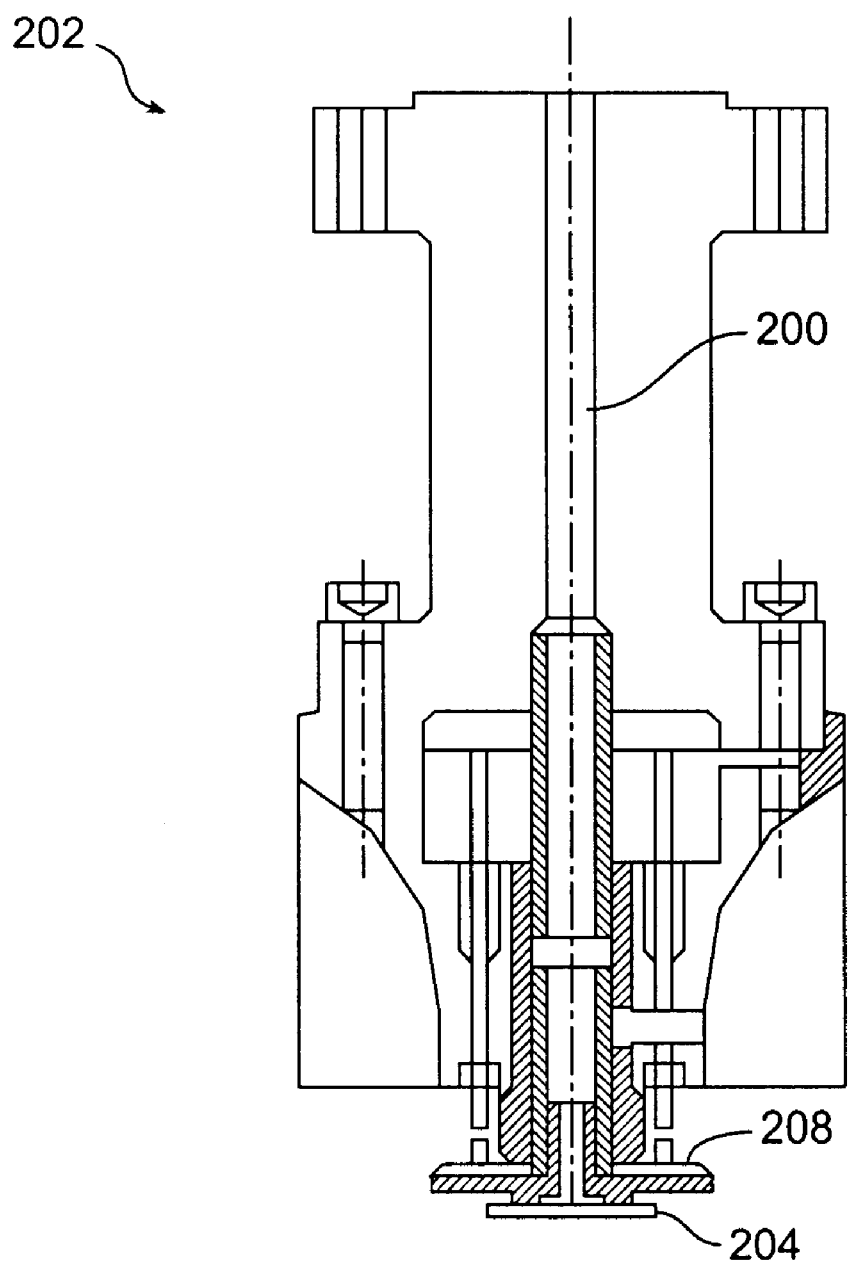
FIG. 2B is an enlargement of a portion of FIG. 2A illustrating the pick-up head portion of an in situ flip chip assembly apparatus in accordance with a specific embodiment of the present invention.

FIG. 2A is an elevational cross-sectional diagram illustrating an in situ flip chip assembly apparatus in accordance with a specific embodiment of the present invention. FIG. 2B is an enlargement of a portion of FIG. 2A illustrating the pick-up head portion of an in situ flip chip assembly apparatus in accordance with a specific embodiment of the present invention. A vacuum line 200 in the pick-up head assembly 202 creates a vacuum to hold the flip chip 204 prior to placement on the target substrate 104. When the pick-up head assembly 202 is properly located over the target substrate 104, the pick-up head 202 places the flip chip 204 onto the target substrate 104 and applies a downward (or "Z") force. The downward force (or "downforce") is variable and typically begins in the range of about 2 to about 10 grams of force and may be increased to a desired level and represents a compressive force between the component (flip chip) and the substrate. Z-axis positioning is provided by the Z-axis drive screw 210 which is driven by the Z-axis motor 212 through Z-axis drive belt 214. The Z-axis motor 212 thus positions the pick-up head assembly 202 vertically and applies desired downforce. A Z-axis encoder 213 which may be a shaft encoder provides feedback to computer 108 in a conventional manner.

A force sensor 206 is incorporated into the pick-up head 202 for sensing the relative force being applied to the flip chip 204. The force sensor 206 is preferably an electronic force sensor such as a strain gauge, force sensitive resistor (FSR), or any other suitable type of force sensor and the sample rate on the sensor 206 is typically higher than 1000 samples per second. This information is passed to computer 108. Those of ordinary skill in the art will now realize that any suitable sensor for measuring force can also be used.

A T-axis motor 216 positions the pick-up head rotationally through a reduction gear 218. An encoder 220 which may be a shaft encoder provides T-axis positional feedback to computer 108.

The entire pick-up assembly 230 shown in FIG. 2A is mounted on an X-Y positioning system 232 for X-Y positioning in a horizontal plane parallel to substrate 104.

Figure 3A:
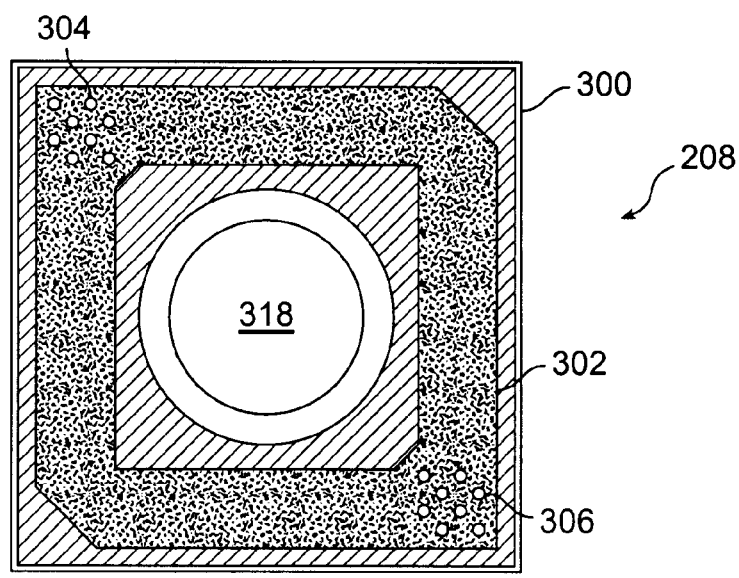
FIGS. 3A and 3B are diagrams illustrating the construction of a heater element used in an in situ flip chip assembly apparatus in accordance with a specific embodiment of the present invention.
Figure 3B:
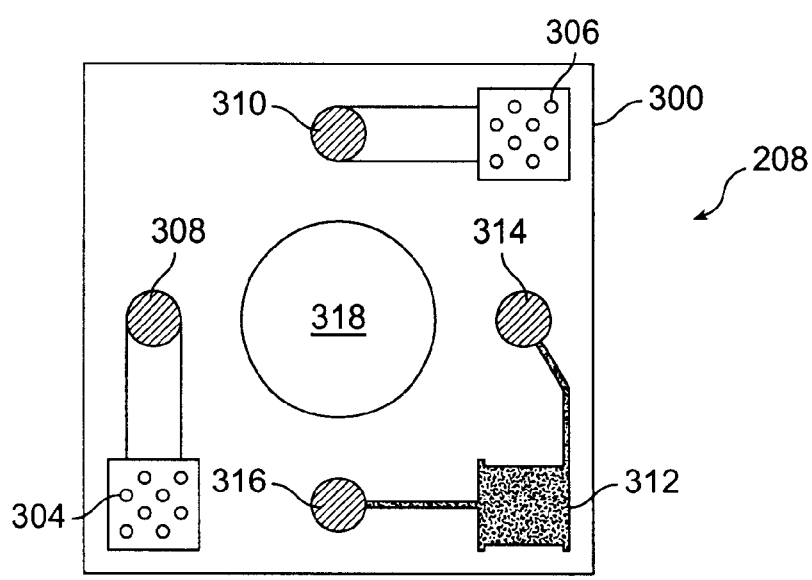

FIGS. 3A and 3B are diagrams illustrating the construction of a heater element 208 (FIGS. 2A and 2B) used in an in situ flip chip assembly apparatus in accordance with a specific embodiment of the present invention. Heater element 208 as illustrated in FIGS. 3A and 3B is incorporated into the pick-up head 202 and supplies heat sufficient to reflow the solder between the flip chip 204 and the target substrate 104. Heater element 208 is preferably a ceramic heater formed of a ceramic substrate 300. A resistive element 302 on the heater-side of the heater element 208 provides electrical heating and is coupled to a power supply (not shown) through vias 304, 306 with electrical contacts 308, 310. The heater element 208 is temperature controlled and includes an electronic temperature sensor 312 such as a thermocouple or resistance temperature detector device. This is coupled to conventional temperature control circuitry with electrical contacts 314, 316. An aperture 318 in heater element 208 allows the heater element 208 to be positioned about a vacuum pick-up nozzle of pick-up head 202. The heater element 208 produces both infra-red and thermal radiation which promotes radiant heating of the flip chip 204 as well as conductive heating through contact. It will also now be realized that any appropriate type of heater may also be used for applying heat to the solder. For example, a hot air supply may be used as may laser or focused light heaters, all such systems being commercially available from a number of vendors and well known to those of ordinary skill in the art. It is also possible to initiate heating at a special workstation of the placement machine, as is presently done for some large ceramic packaged semiconductor products, and complete the heating with a pick-up head mounted heater.

In operation, the pick-up head 202 of the in-situ flip chip assembly apparatus picks up a flip chip from a component feeder or other component storage unit and places it down solder bumps facing down in the proper location on a target substrate 104. A downward force is applied to the flip chip 204 by the pick-up head 202, and heat is applied to both the flip chip 204 and target substrate 104 by contact through the pick-up head 202 and radiant heat from the pick-up head 202. While the heat and force are applied, the force sensor 206 is used to determine the exact instant that the solder between the flip chip 204 and target substrate 104 begins to melt. This happens at the moment the force sensor 206 senses a decrease in the upward force being returned from the flip chip 204. At the moment the force sensor 206 senses the melting point of the solder, the pick-up head 202 begins reducing the downward force being applied to the flip chip 204 to zero and releases the vacuum which holds the flip chip 204. When the vacuum holding the flip chip 204 is released, the pick-up head 202 backs off from flip chip 204 a slight distance. This distance is very small however, typically about 0.5 millimeters, and permits the continued radiant heating of the flip chip 204 and target substrate 104 while the flip chip 204 is detached from the pick-up head 202. The flip chip 204 then properly settles in place onto the target substrate 104 using the liquid tension of the melting solder.

In addition to placing flip chips onto bare target substrates, the in situ flip chip assembly apparatus of the present invention can also place flip chips onto pre-assemble circuit boards. These circuit boards may already have been mass reflowed and tested prior to having the flip chip applied in situ by the in situ flip chip assembly apparatus.

Figure 4:
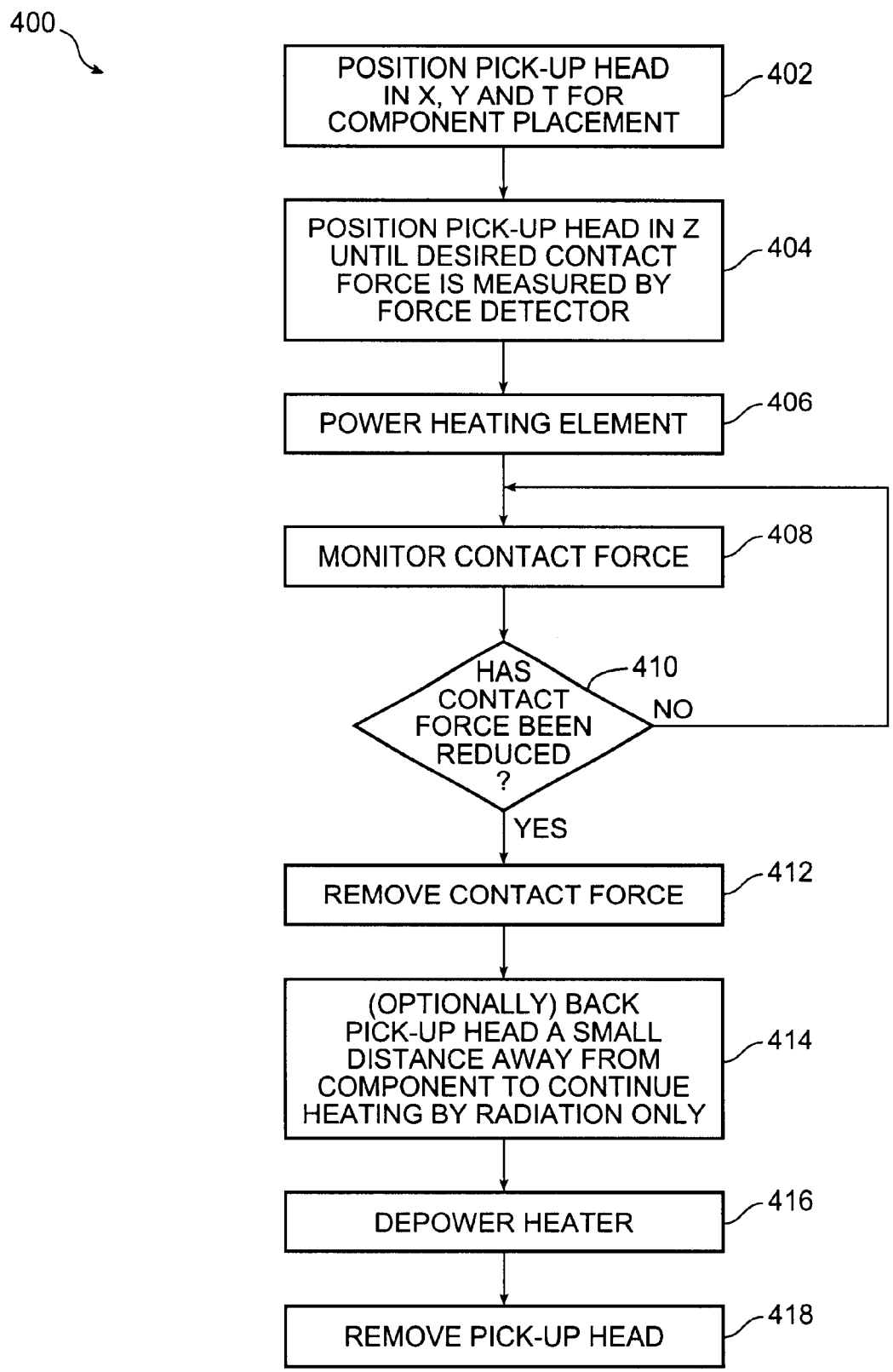
FIG. 4 is a process flow diagram illustrating a process for in situ flip chip assembly in accordance with a specific embodiment of the present invention.

FIG. 4 is a process flow diagram illustrating a process for in situ flip chip assembly in accordance with a specific embodiment of the present invention. Turning now to FIG. 4, process 400 begins at block 402 where the pick-up head with a component gripped in position is positioned in the X, Y and T directions for placement on a substrate. At block 404 the pick-up head is lowered in the Z direction until a desired downforce is measured by a force detector (element 206 in FIG. 2A). At block 406 the heating element is powered to begin the reflow process in the vicinity of the component. At block 408 the downforce is monitored. Since downforce will decrease when the solder begins to reflow, the change in downforce can be used as a trigger to reduce all downforce pressure and optionally to remove the pick-up head a small distance so that all heating of the component/substrate is due to radiative heating. At block 410, control passes back to block 408 until a reduction in downforce pressure is detected. Once the reduction is detected, control passes to block 412 and all contact force is reduced by reducing the pressure applied by the Z-axis drive screw 210. At block 414, optionally the pick-up head is moved a small distance away (e.g., approximately 0.5 mm) from the component to continue heating by radiation only. Once the reflow process is completed, the heating element is depowered at block 416 and the pick-up head is removed at block 418.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for in situ assembly of a flip chip semiconductor package to a substrate, comprising:

positioning a pick-up head holding the package over the substrate;

lowering the package into contact with the substrate;

applying a downforce to the package;

applying heat to the package;

monitoring the downforce; and removing all downforce when a reduction in downforce is detected.

2. A method in accordance with claim 1, further comprising:

displacing the pick-up head a small distance from the package in response to said reduction in downforce.

3. A method in accordance with claim 2, further comprising:

continuing to apply heat for a time after said displacing.

4. A method for assembling a semiconductor package to a substrate, comprising:

holding the package on a pick-up head of a placement machine;

placing the package onto the substrate;

applying a downforce to the package;

heating the package and the substrate from a heater disposed on the pick-up head;

sensing the downforce being applied to the package; and decreasing the applied downward force in response to sensing a decrease in the downforce.

5. A method in accordance with claim 4, further comprising:

releasing the package from the pick-up head in response to said decreasing.

6. A method in accordance with claim 5, further comprising:

displacing the pick-up head a small distance from the package after said releasing.

7. A method in accordance with claim 6, further comprising:

continuing said heating for a time after said displacing.

8. A method for assembly of a component to a substrate, comprising:

positioning a pick-up head holding the component over the substrate;

lowering the component into contact with the substrate;

applying a compressive force between the component and the substrate;

performing a bonding process to bond the component to the substrate;

monitoring the compressive force; and removing all compressive force when a reduction in compressive force is detected.

9. A method in accordance with claim 8, wherein said performing includes applying heat to the component.

10. A method in accordance with claim 9, further comprising:

displacing the pick-up head a small distance from the component in response to said reduction in compressive force.

11. A method in accordance with claim 10, further comprising:

continuing to apply heat for a time after said displacing.

* * * * *